(12) United States Patent
Ifuku et al.

(10) Patent No.: US 12,116,280 B2
(45) Date of Patent: Oct. 15, 2024

(54) METHOD AND APPARATUS FOR FORMING GRAPHENE STRUCTURE

(71) Applicant: Tokyo Electron Limited, Tokyo (JP)

(72) Inventors: Ryota Ifuku, Nirasaki (JP); Takashi Matsumoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1002 days.

(21) Appl. No.: 17/041,649

(22) PCT Filed: Mar. 1, 2019

(86) PCT No.: PCT/JP2019/008151
§ 371 (c)(1),
(2) Date: Sep. 25, 2020

(87) PCT Pub. No.: WO2019/187987
PCT Pub. Date: Oct. 3, 2019

(65) Prior Publication Data
US 2021/0047186 A1 Feb. 18, 2021

(30) Foreign Application Priority Data
Mar. 30, 2018 (JP) .................. 2018-067448

(51) Int. Cl.
*C01B 32/186* (2017.01)
*H01M 4/62* (2006.01)
*H05H 1/46* (2006.01)

(52) U.S. Cl.
CPC .......... *C01B 32/186* (2017.08); *H01M 4/625* (2013.01); *H05H 1/46* (2013.01)

(58) Field of Classification Search
CPC ... C01B 32/186; H01M 4/625; H01M 8/0234; H05H 1/46; Y02E 60/10; H01J 37/3222;
(Continued)

(56) References Cited

U.S. PATENT DOCUMENTS

| | | | |
|---|---|---|---|
| 9,911,544 B1 * | 3/2018 | Meyyappan | H01G 11/28 |
| 2013/0052119 A1 * | 2/2013 | Kim | B82Y 40/00 |
| | | | 423/445 B |
| 2016/0075560 A1 * | 3/2016 | Kagaya | C23C 16/45574 |
| | | | 427/249.1 |

FOREIGN PATENT DOCUMENTS

| | | | | |
|---|---|---|---|---|
| JP | 2011-168448 A | | 9/2011 | |
| JP | 2012-162442 | * | 8/2012 | ............. C01B 31/02 |

(Continued)

OTHER PUBLICATIONS

Fronczak, et al., Continuous and catalyst free synthesis of graphene sheets in thermal plasma jet, Chemical Engineering Journal 2017; 322: 385-396 (Year: 2017).*

(Continued)

*Primary Examiner* — Daniel C. McCracken
(74) *Attorney, Agent, or Firm* — Nath, Goldberg & Meyer; Jerald L. Meyer; Tanya E. Harkins

(57) ABSTRACT

A method of forming a graphene structure includes providing a substrate to be processed and forming a graphene structure on a surface of the substrate to be processed through a plasma CVD using plasma of a processing gas including a carbon-containing gas and an oxidizing gas in a state in which the surface of the substrate to be processed does not have a catalytic function.

9 Claims, 15 Drawing Sheets

(58) Field of Classification Search
CPC ............. H01J 37/32211; H01J 37/3244; H01J 37/32724; C23C 16/511
See application file for complete search history.

(56) References Cited

FOREIGN PATENT DOCUMENTS

| | | |
|---|---|---|
| JP | 2012-162442 A | 8/2012 |
| JP | 2013-100205 A | 5/2013 |
| JP | 2014-167142 A | 9/2014 |
| JP | 2014-231455 A | 12/2014 |
| JP | 2017-220408 A | 12/2017 |

OTHER PUBLICATIONS

Dacheng, Wei et al. "Critical Crystal Growth of Graphene on Dielectric Substrates at Low Temperature for Electronic Devices" Angewandte Chemie International Edition; 2013;52;14121-14126.
Rong , Yang et al."An Anisotropic Etching Effect in the Graphene Basal Plane" Advanced Materials; 2010; 22(36):4014-9.

\* cited by examiner

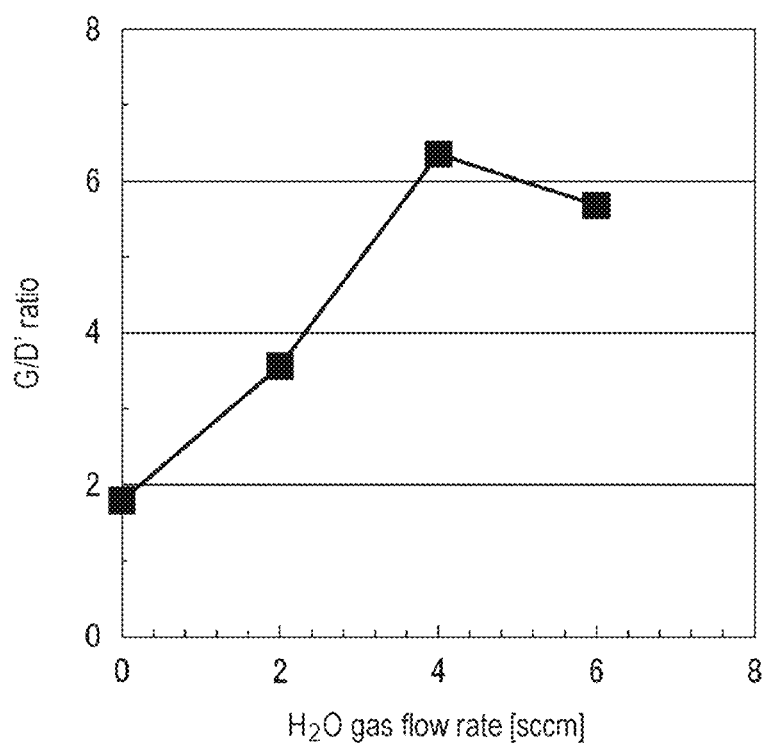

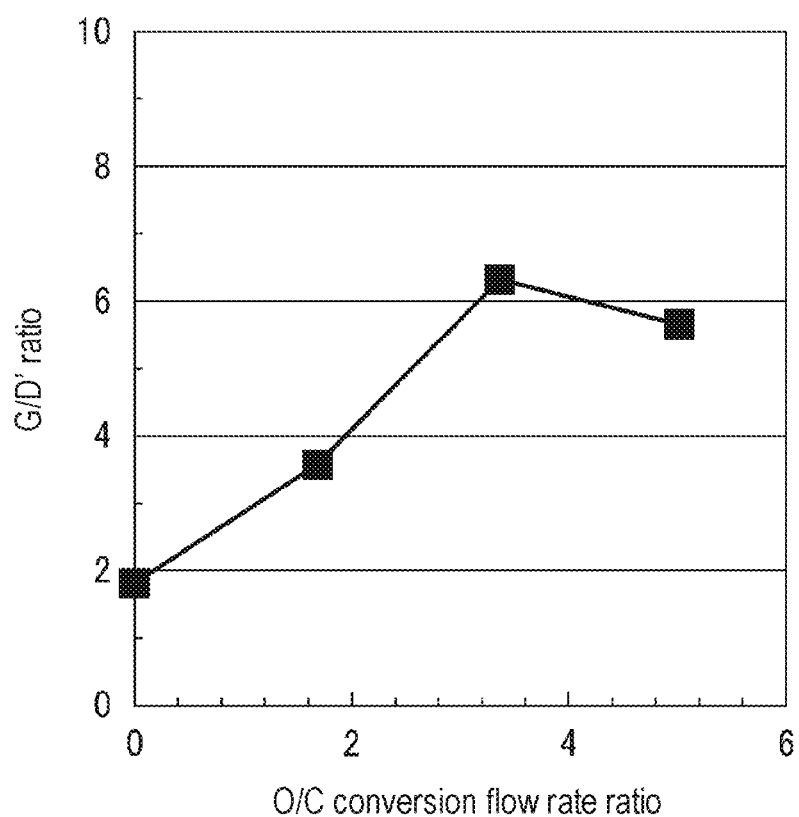

METHOD AND APPARATUS FOR FORMING
GRAPHENE STRUCTURE

This is a National Phase Application filed under 35 U.S.C. 371 as a national stage of PCT/JP2019/008151, filed Mar. 1, 2019, an application claiming the benefit of Japanese Application No. 2018-067448, filed Mar. 30, 2018, the content of each of which is hereby incorporated by reference in its entirety.

TECHNICAL FIELD

The present disclosure relates to a method and apparatus for forming a graphene structure.

BACKGROUND

Graphene is a thin film of graphite having 1 to several tens or several hundreds of atomic layers formed on a substrate. As a graphene structure, in addition to normal graphene formed parallel to the substrate, there is known a carbon nanowall (hereinafter, also referred to as CNW) in which several layers of graphene sheets are grown at an angle with respect to the substrate, typically at a right angle.

Graphene is configured as an aggregate of a six-membered ring structures by covalent bonds ($sp^2$ bonds) of carbon atoms, and shows unique electronic characteristics with a mobility of 200,000 $cm^2$/Vs or more, which is 100 times or more that of silicon (Si), and a current density of $10^9$ A/$cm^2$, which is 1,000 times or more that of Cu.

Due to these characteristics, graphene has attracted attention as a material for various devices such as wirings, a field effect transistor (FET) channel, a barrier film and the like. Further, due to the structural characteristics, CNW has attracted attention as a material for various devices such as a fuel cell, a field electron emission source, a sensor and the like.

As a method for forming graphene, there has been proposed a method which includes forming a catalyst metal layer on an object to be processed, activating the catalyst metal layer and then forming graphene through CVD. In an embodiment, CVD using microwave plasma is disclosed as an example of the CVD (Patent Documents 1 and 2).

In addition, Non-Patent Document 1 discloses that defects present in an edge of graphene are etched away by adding a $H_2$ gas to a plasma CVD atmosphere when forming the graphene on a dielectric substrate by the plasma CVD without using a catalytic metal layer.

Non-Patent Document 2 discloses that etching using hydrogen radicals is performed on a graphene structure with an extremely high selectivity.

PRIOR ART DOCUMENTS

Patent Document

Patent Document 1: Japanese Laid-Open Patent Publication No. 2013-100205
Patent Document 2: Japanese Laid-Open Patent Publication No. 2014-231455

Non-Patent Document

Non-Patent Document 1: Dacheng Wei et al., Angewandte Chemie International Edition, 2013, 52, 14121-14126

Non-Patent Document 2: Rong yang et al., Advanced Materials, 2010; 22(36): 4014-9

SUMMARY

The present disclosure provides a method and apparatus for forming a graphene structure capable of forming a graphene structure having good crystallinity without using a catalytic metal layer.

According to an embodiment of the present disclosure, a method of forming a graphene structure includes: a step of providing a substrate to be processed, and a step of forming a graphene structure on a surface of the substrate to be processed through a plasma CVD using plasma of a processing gas including a carbon-containing gas and an oxidizing gas in a state in which the surface of the substrate to be processed does not have a catalytic function.

According to the present disclosure, it is possible to form a graphene structure having good crystallinity without using a catalyst metal layer.

BRIEF DESCRIPTION OF DRAWINGS

FIG. 15 is a view illustrating a relationship between the flow rate of the $H_2O$ gas and a G/D' ratio in Test Example 2.

FIG. 16 is a view illustrating a relationship between an O/C conversion flow rate ratio obtained by converting the flow rate of the $H_2O$ gas and a flow rate ratio of a $C_2H_2$ gas by the number of oxygen atoms/the number of carbon atoms, and the G/D' ratio, in Test Example 2.

DETAILED DESCRIPTION

Figure 1:
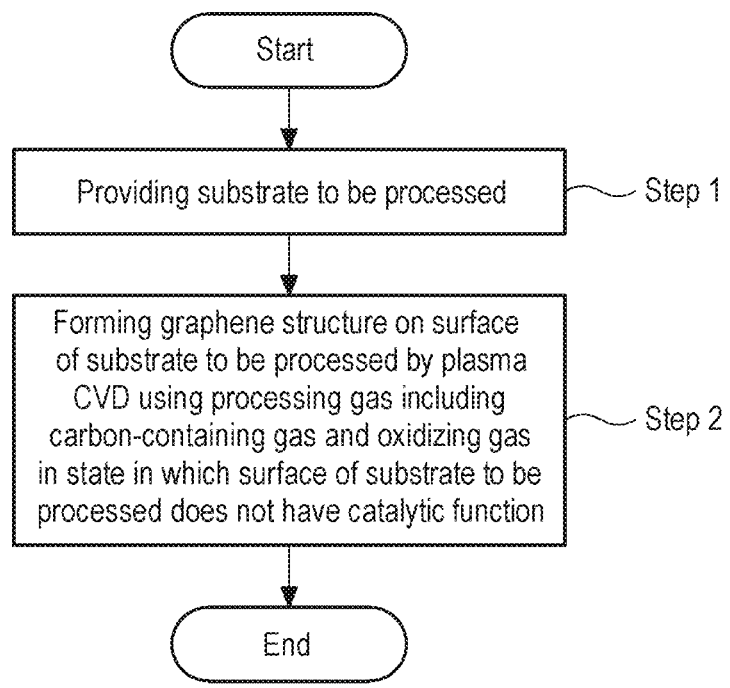
FIG. 1 is a flowchart illustrating a graphene structure forming method according to an embodiment of the present disclosure.

Hereinafter, embodiments will be described in detail with reference to the accompanying drawings.

Embodiment of Method of Forming Graphene Structure

First, an embodiment of a method for forming a graphene structure will be described. In Patent Documents 1 and 2 disclosed above, in order to efficiently grow graphene having good crystallinity at an extremely low temperature, a catalytic metal film serving as a catalyst that promotes the growth of graphene, such as Ni, is formed as a base. Then, the catalytic metal layer is activated by plasma of a $H_2$ gas as a reducing gas and a Na gas as a nitrogen-containing gas so that the graphene is grown by plasma CVD (PE-CVD). That is, in Patent Documents 1 and 2, the graphene is grown by dissociating a film-forming raw material gas (precursor) using a catalytic reaction by the metal catalyst layer.

In contrast, the method of the present embodiment is different in principle from the catalytic reaction using the activated metal catalyst as in Patent Documents 1 and 2. That is, the method of the present embodiment prompts growth reaction of a graphene structure according to a general crystal growth mode such as nucleation and lateral growth by appropriately dissociating a carbon-containing gas as a film-forming raw material gas at a relatively low temperature using plasma. Therefore, complicated processes such as the formation of the catalytic metal layer and the activation process are unnecessary.

When the graphene structure is formed using such a film formation principle, in order to control defects in the graphene structure and improve crystallinity, it is important to promote growth while removing a defective structure generated during the growth reaction.

In this regard, in Non-Patent Document 1, a $H_2$ gas is added to the plasma CVD atmosphere when forming graphene by plasma CVD without using a catalyst metal layer. As a result, a non-graphene structure (defects) is etched according to a very simple chemical equilibrium equation of $C_xH_y$ (gas)↔C (graphene)+$H_2$ (gas) so as to improve the crystallinity thereof.

Meanwhile, in Non-Patent Document 2, it is described that when a graphene structure containing defects (non-graphene structure) is etched using $H_2$ radicals (or hydrogen ions), selectivity is very high. From this, it is highly possible that a defect removal action by $H_2$ plasma strongly appears in a specific defect.

Therefore, as a result of investigations, it was found that, by etching defects as a whole by adding a trace amount of oxidizing gas into the plasma CVD atmosphere, it is possible to obtain a graphene structure with high crystallinity.

The action of the oxidizing gas when forming the graphene film is disclosed in Japanese Patent Laid-Open Publication No. 2017-66506. In this document, the oxidizing gas is described to have an etching action. However, in this document, the oxidizing gas is described to adversely affect $sp^2$ bonds, which are bonds that form common graphene. However, the technique disclosed in Japanese Patent Laid-Open Publication No. 2017-66506 uses the catalytic action of a metal catalyst layer. Therefore, tests were conducted using an oxidizing gas in a system that does not use a metal catalyst layer. As a result, it was found that the oxidizing gas contributes to the improvement of the crystallinity of the graphene structure without adversely affecting the $sp^2$ bonds.

The graphene structure forming method of the present embodiment includes step 1 and step 2, as illustrated in FIG. 1. Step 1 is a step of providing a substrate to be processed. Step 2 is a step of forming a graphene structure on a surface of the substrate to be processed by plasma CVD using a processing gas including a carbon-containing gas and an oxidizing gas in a state in which the surface of the substrate to be processed does not have a catalytic function.

The substrate to be processed in step 1 may be any substrate whose surface on which the graphene structure is to be formed does not have the catalytic function during the plasma CVD in step 2. The surface may be a semiconductor or an insulator. In addition, the surface of the substrate to be processed may be made of metal as long as the surface of the substrate to be processed does not have a catalytic function during the plasma CVD process.

Figure 2A:
FIG. 2A is a cross-sectional view illustrating a specific example of a structure of a substrate to be processed used in the graphene structure forming method according to the embodiment of the present disclosure.
Figure 2B:
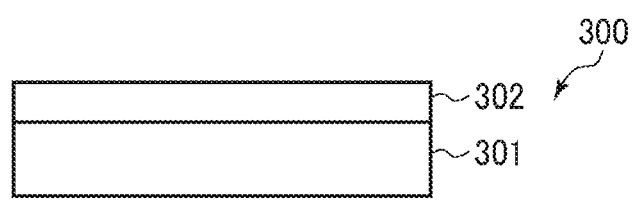
FIG. 2B is a cross-sectional view illustrating a specific example of the structure of the substrate to be processed used in the graphene structure forming method according to the embodiment of the present disclosure.
Figure 2C:
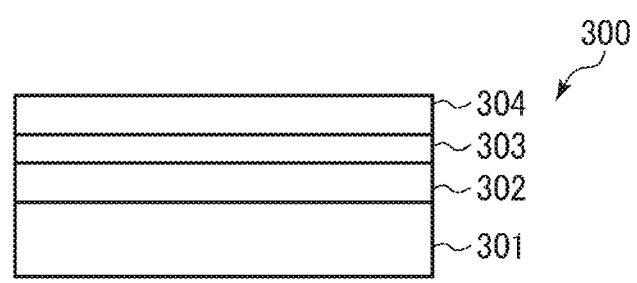
FIG. 2C is a cross-sectional view illustrating a specific example of the structure of the substrate to be processed used in the graphene structure forming method according to the embodiment of the present disclosure.

FIGS. 2A to 2C illustrate specific examples of the substrate to be processed. A semiconductor wafer may be typically used as a substrate to be processed 300. The substrate to be processed 300 may be any of those exemplified in FIGS. 2A, 2B, and 2C. In the example of FIG. 2A, the substrate to be processed 300 includes only a semiconductor substrate 301 formed of a semiconductor such as silicon. In the example of FIG. 2B, the substrate to be processed 300 includes an insulating film 302 such as a $SiO_2$ film, which is formed on the semiconductor substrate 301 made of silicon or the like. In the example of FIG. 2C, the substrate to be processed 300 includes a metal film 304 such as a Cu film, which is formed on the semiconductor substrate 301 made of silicon or the like, via the insulating film 302 such as an $SiO_2$ film, and a barrier film 303 such as a TaN film, a Ta film, a TiN film or the like. The barrier film 303 may be omitted depending on the metal. In addition, the barrier film 303 may be a laminated film (e.g., Ta/TaN).

Figure 3:
FIG. 3 is a cross-sectional view illustrating a state in which the graphene structure is formed on the substrate to be processed through the graphene structure forming method according to the embodiment of the present disclosure.

In step 2, the substrate to be processed 300 is accommodated in a processing container, and plasma of the processing gas including the carbon-containing gas and the oxidizing gas is applied to the substrate to be processed 300. As a result, as shown in FIG. 3, a graphene structure 310 is grown on the substrate to be processed 300.

The plasma used at this time may be a remote microwave plasma. The remote microwave plasma introduces microwaves into the processing container to generate plasma by a microwave electric field. The plasma diffused from a plasma generation region acts on the substrate to be processed 300 which is disposed at a position spaced apart from the plasma generation region. By using the remote microwave plasma, it is possible to dissociate the carbon-containing gas into a state suitable for growth of the graphene structure at a relatively low temperature.

In this case, the microwave plasma may be generated by introducing microwaves into the processing container and introducing a plasma-generating gas composed of a noble gas into the processing container. Then, the carbon-containing gas as the film-forming raw material gas is dissociated by the plasma and is supplied to the substrate to be processed 300, which is spaced apart from the plasma generation region, so that the graphene structure 310 is grown on the substrate to be processed 300.

Ar, He, Ne, Kr, Xe or the like may be used as the noble gas. Among these, Ar capable of stably generating plasma may be used.

As the carbon-containing gas, which is a film-forming raw material gas, for example, a hydrocarbon gas, such as ethylene ($C_2H_4$), methane ($CH_4$), ethane ($C_2H_6$), propane ($C_3H_8$), propylene ($C_3H_6$), acetylene ($C_2H_2$) or the like, or an alcohol gas, such as methanol ($CH_3OH$), ethanol ($C_2H_5OH$) or the like, may be used.

The oxidizing gas is a gas for etching defects (non-graphene structure) included in the growing graphene structure 310, and may be, for example, an oxygen gas ($O_2$ gas). In addition, the oxidizing gas may be a gas containing hydrogen. As such a gas, for example, steam ($H_2O$ gas) may be used. Further, a hydrogen gas ($H_2$ gas) may be introduced together with the oxidizing gas. Hydrogen also has an effect of etching defects (non-graphene structure) included in the graphene structure 310. Thus, by using the oxidizing gas containing hydrogen or by using the $H_2$ gas together with the oxidizing gas, it is possible to further enhance the crystallinity of the graphene structure. As the oxidizing gas containing no hydrogen, $O_2$, $O_3$, CO, or $CO_2$ may be used in addition to the $O_2$ gas. As the oxidizing gas containing hydrogen, $H_2O_2$ may be used in addition to the $H_2O$ gas.

In the case of using the remote microwave plasma, the film-forming raw material gas may be introduced to an arbitrary position between the plasma generation region and a region near the substrate to be processed, depending on a desired degree of dissociation. That is, in the plasma generation region, the degree of dissociation increases due to high-energy plasma, and in the region near the substrate to be processed, the degree of dissociation becomes lower than that in the plasma generation region due to low electron temperature plasma diffused from the plasma generation region. Therefore, the degree of dissociation of the film-forming raw material gas may be adjusted depending on the introduction position of the film-forming raw material gas.

Further, in the case of using the remote microwave plasma, the substrate to be processed is disposed in the region spaced apart from the microwave-plasma generation region, and plasma diffused from the plasma generation region is supplied to the substrate to be processed. For this reason, the low electron temperature plasma is generated on the substrate to be processed so that the substrate is damaged less, and is turned into high-density plasma mainly composed of radicals by microwaves. Accordingly, the graphene structure 310 may be relatively easily formed on the substrate that does not use an activated metal catalyst layer.

The graphene structure may be simply ordinary graphene formed parallel to the substrate, or may include a carbon nanowall (CNW) grown at an angle with respect to the substrate, in addition to the graphene.

In process conditions applied when using the remote microwave plasma, the temperature of the substrate to be processed may be 350 to 1,000 degrees C. (more specifically 400 to 800 degrees C.), and the microwave power may be 100 to 5,000 W. When the surface of the substrate to be processed is formed of an insulator or a semiconductor, an internal pressure of the processing container may be 1.33 to 667 Pa (0.01 to 5 Torr). When the surface of the substrate to be processed is formed of metal, the internal pressure of the processing container may be 1.33 to 400 Pa (0.01 to 3 Torr). These pressure ranges are lower than those disclosed in Patent Documents 1 and 2. Therefore, the low pressure range is more advantageous for forming a graphene structure without providing an activated catalytic metal layer. The time may be in the range of 1 to 200 min.

When the oxidizing gas does not contain hydrogen, like an $O_2$ gas, a ratio of a flow rate of the oxidizing gas to a flow rate of the carbon-containing gas may be 0.1 to 0.5 in terms of a value (O/C conversion flow rate ratio) obtained by converting the flow rate ratio into the number of oxygen atoms in the oxidizing gas/the number of carbon atoms in the carbon-containing gas (O/C). When the oxidizing gas contains hydrogen, like a $H_2O$ gas, the ratio of the flow rate of the oxidizing gas to the flow rate of the carbon-containing gas may be 4 or less in terms of the O/C conversion flow rate ratio. Further, when the $H_2$ gas is introduced in addition to the oxidizing gas and when the oxidizing gas is an $O_2$ gas, the appropriate range of the flow rate ratio ($H_2$ gas/$O_2$ gas) may be 0.01 to 100. The flow rate of each of the carbon-containing gas, the oxidizing gas, the $H_2$ gas, and the noble gas is appropriately set depending on the type of the respective gas and an apparatus to be used.

A surface process of cleaning the surface of the substrate to be processed may be performed prior to the generation of the graphene structure by the plasma CVD in step 2. An example of the surface process may include supplying a $H_2$ gas or an Ar gas+the $H_2$ gas while heating the substrate to be processed to a temperature of 300 to 600 degrees C. At this time, plasma may be generated. The surface processing is intended only to clean the surface, and is different from the activation process. Accordingly, the surface process may be performed not only when the surface of the substrate to be processed is formed of a semiconductor or an insulator, but also when the surface is formed of metal.

<Processing Apparatus>

Next, examples of a processing apparatus suitable for carrying out the graphene structure forming method according to the above-described embodiment will be described.

[First Example of Processing Apparatus]

Figure 4:
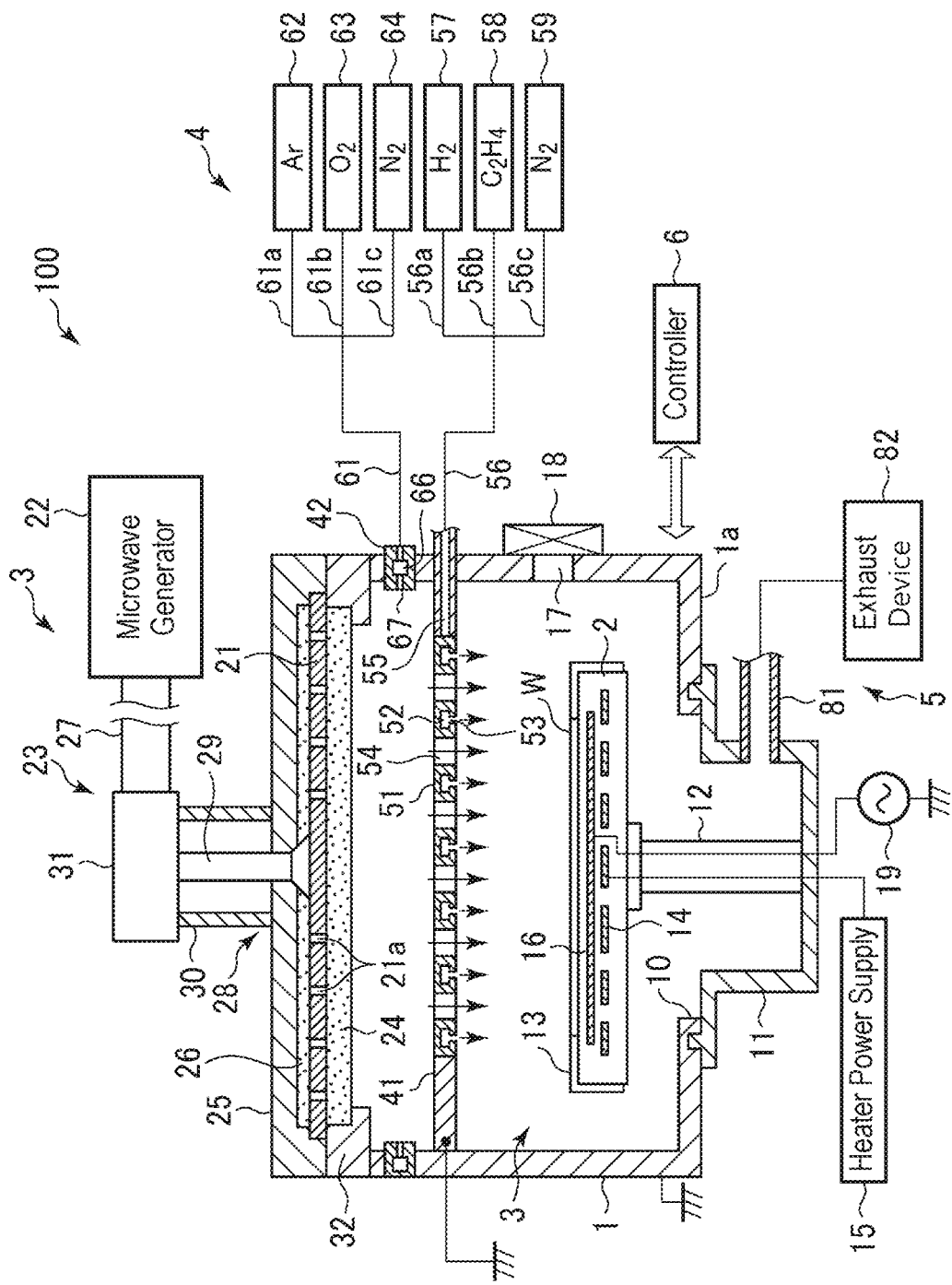
FIG. 4 is a cross-sectional view illustrating a first example of a processing apparatus suitable for carrying out the graphene structure forming method according to the embodiment of the present disclosure.

FIG. 4 is a cross-sectional view schematically illustrating a first example of the processing apparatus. The processing apparatus 100 illustrated in FIG. 4 is configured as, for example, an RLSA (registered trademark) microwave plasma type of plasma-processing apparatus.

The processing apparatus 100 includes a processing container 1, a stage 2, a microwave introduction mechanism 3, a gas supply mechanism 4, an exhaust part 5, and a controller 6.

The processing container 1 has a substantially cylindrical shape. A circular opening portion 10 is formed in a substantially central portion of a bottom wall 1a of the processing container 1. An exhaust chamber 11 is provided in the bottom wall 1a to communicate with the opening portion 10 and to protrude downward. A side wall of the processing container 1 is provided with a loading/unloading port 17 for loading/unloading a wafer W therethrough and a gate valve 18 for opening/closing the loading/unloading port 17.

The stage 2 is provided inside the processing container 1, and places thereon, for example, a semiconductor wafer (hereinafter simply referred to as a "wafer") W as a substrate to be processed. The stage 2 has a disc shape and is made of ceramic, such as AlN. The stage 2 is supported by a cylindrical support member 12 made of ceramic, such as AlN, which extends upward from the center of the bottom of the exhaust chamber 11. A guide ring 13 for guiding the wafer W is provided on an outer edge portion of the stage 2. In addition, lifting pins (not illustrated) for moving the wafer W up and down are provided inside the stage 2 so as to be able to move up and down on a top surface of the stage 2. Further, a resistive heater 14 is embedded inside the stage 2. The heater 14 is supplied with power from the heater power supply 15 so as to heat the wafer W on the stage 2 via the stage 2. A thermocouple (not illustrated) is inserted into the stage 2. The stage 2 is configured to be capable of controlling a heating temperature of the wafer W to a predetermined temperature falling within a range of, for example, 350 to 1,000 degrees C., based on a signal from the thermocouple. Further, an electrode 16 having a size similar to that of the wafer W is embedded above the heater 14 in the stage 2. A high-frequency bias power supply 19 is electrically connected to the electrode 16. A high-frequency bias for attracting ions is applied from the high-frequency bias power supply 19 to the stage 2. The high-frequency bias power supply 19 may be omitted depending on characteristics of plasma processing.

The microwave introduction mechanism 3 is used for introducing microwaves into the processing container 1, and is provided so as to face an opening portion of an upper portion of the processing container 1. The microwave introduction mechanism 3 includes a planar slot antenna 21, a microwave generator 22, and a microwave transmission mechanism 23.

The planar slot antenna 21 is made of, for example, a copper plate or an aluminum plate, the surface of which is plated with silver or gold, and has a configuration in which a plurality of slots 21a for radiating microwaves are formed to penetrate the plate in a predetermined pattern. The pattern of the slots 21a is appropriately set such that the microwaves are evenly radiated. An example of the suitable pattern may include a radial line slot in which plural pairs of slots 21a are concentrically arranged, with each pair composed of two slots 32 paired in a T-shape. The length and the arrangement interval of the slots 21a are appropriately determined according to an effective wavelength $\lambda g$ of the microwaves. The slots 21a may have another shape, such as a circular shape or an arc shape. The arrangement form of the slots 21a is not particularly limited, and the slots 21a may be arranged, for example, in a spiral shape or a radial shape, in addition to the concentric shape. The pattern of the slots 21a is appropriately set so as to have a microwave radiation characteristic that is capable of obtaining a desired plasma density distribution.

A microwave transmission plate 24 made of a dielectric material is provided below the planar slot antenna 21 so as to be supported by an upper plate 32 provided in a ring shape in the upper portion of the processing container 1. A water cooling type of shield member 25 is provided on the planar slot antenna 21. Further, a slow-wave material 26 is provided between the shield member 25 and the planar slot antenna 21.

The slow-wave material 26 is made of a dielectric material having a dielectric constant higher than a vacuum, for example, quartz, ceramic ($Al_2O_3$), or a resin such as polytetrafluoroethylene, polyimide or the like. The slow-wave material 26 has a function of making the wavelength of the microwaves shorter than that in a vacuum, thereby reducing the size of the planar slot antenna 21. The microwave transmission plate 24 is also made of the same dielectric material.

The thicknesses of the microwave transmission plate 24 and the slow-wave material 26 are adjusted such that an equivalent circuit formed by the slow-wave material 26, the planar slot antenna 21, the microwave transmission plate 24, and the plasma satisfies resonance conditions. By adjusting the thickness of the slow-wave material 26, it is possible to adjust the phase of microwaves. By adjusting the thickness of the planar slot antenna 21 such that a joint portion of the planar slot antenna 21 becomes an antinode of a standing wave, the reflection of microwaves is minimized and the radiant energy of microwaves is maximized. In addition, by fabricating the slow-wave material 26 and the microwave transmission plate 24 using the same material, it is possible to prevent the interface reflection of microwaves.

The microwave generator 22 is for generating microwaves, and has a microwave oscillator. The microwave oscillator may be a magnetron or a solid state. The frequency of microwaves oscillated from the microwave oscillator may be in a range of 300 MHz to 10 GHz. For example, by using the magnetron as the microwave oscillator, it is possible to oscillate microwaves having a frequency of 2.45 GHz.

The microwave transmission mechanism 23 is for guiding the microwaves from the microwave generator 22 to the planar slot antenna 21. The microwave transmission mechanism 23 has a waveguide 27, a coaxial waveguide 28, and a mode conversion mechanism 31. The waveguide 27 guides the microwaves from the microwave generator 22 and extends in the horizontal direction. The coaxial waveguide 28 includes an inner conductor 29 and an outer conductor 30 provided outside the inner conductor 29, which extend upward from the center of the planar slot antenna 21. The mode conversion mechanism 31 is provided between the waveguide 27 and the coaxial waveguide 28, and is for converting a vibration mode of the microwaves. The microwaves generated by the microwave generator 22 propagate through the waveguide 27 in a TE mode. The microwave vibration mode is converted from the TE mode to a TEM mode by the mode conversion mechanism 31, so that the microwaves are guided to the slow-wave material 26 through the coaxial waveguide 28. Then, the microwaves are radiated from the slow-wave material 26 into the processing container 1 through the slots 21a of the planar slot antenna 21 and the microwave transmission plate 24. A tuner (not illustrated) is provided in the waveguide 27 to match the impedance of a load (plasma) inside the processing container 1 with the characteristic impedance of the power supply of the microwave generator 22.

The gas supply mechanism 4 includes a shower plate 41 horizontally provided above the stage inside the processing container 1 so as to partition upper and lower portions of the interior of the processing container 1, and a shower ring 42 provided above the shower plate 41 along an inner wall of the processing container 1 in a ring shape.

The shower plate 41 has gas circulation members 51 each formed in a grid shape, gas flow paths 52 provided in a grid shape inside the respective gas circulation member 51, and a large number of gas ejection holes 53 extending downward from the gas flow paths 52. Portions between adjacent ones of the grid-shaped gas circulation members 51 correspond to through-holes 54. The gas flow paths 52 of the shower plate 41 extend a gas supply path 55 reaching an outer wall of the processing container 1. A gas supply pipe 56 is connected to the gas supply path 55. The gas supply pipe 56 is branched into three branch pipes 56a, 56b, and 56c. A $H_2$ gas source 57 is connected to the branch pipe 56a to supply a $H_2$ gas, which is a hydrogen-containing gas. A $C_2H_4$ gas source 58 is connected to the branch pipe 56b to supply an ethylene ($C_2H_4$) gas as a carbon-containing gas, which is a film-forming raw material gas. A $N_2$ gas source 59 is connected to the branch pipe 56c to supply a $N_2$ gas used as a purge gas or the like. Although not illustrated, each of the branch pipes 56a, 56b, and 56c includes a mass flow controller for controlling a flow rate of each gas, and valves provided on the front and back sides of the mass flow controller.

The shower ring 42 includes a ring-shaped gas flow path 66 provided therein and a large number of gas ejection holes 67 that are connected to the gas flow path 66 and opened inward of the gas flow path 66. A gas supply pipe 61 is connected to the gas flow path 66. The gas supply pipe 61 is branched into three branch pipes 61a, 61b, and 61c. An Ar gas source 62 is connected to the branch pipe 61a to supply an Ar gas as a noble gas, which is a plasma-generating gas. An $O_2$ gas source 63 is connected to the branch pipe 61b to supply an $O_2$ gas, which is an oxidizing gas for etching defects (non-graphene structure). An $N_2$ gas source 64 is connected to the branch pipe 61c to supply a $N_2$ gas used as a purge gas or the like. Although not illustrated, each of the branch pipes 61a, 61b, and 61c includes a mass flow controller for controlling a flow rate of each gas and valves provided front and back sides of the mass flow controller. The carbon-containing gas, the oxidizing gas, and the noble gas are not limited to these, and various gases described above may be used.

The exhaust part 5 is for evacuating the interior of the processing container 1, and includes the exhaust chamber 11, an exhaust pipe 81 provided in the side surface of the exhaust chamber 11, and an exhaust device 82 connected to the exhaust pipe 81 and having a vacuum pump, a pressure control valve and the like.

The controller 6 typically includes a computer, and controls each part of the processing apparatus 100. The controller 6 includes a storage storing a process sequence of the processing apparatus 100 and process recipes that are control parameters, an input device, a display, and the like, and is capable of performing a predetermined control according to a selected process recipe.

The formation of the graphene structure according to the above-described embodiment using the processing apparatus 100 configured as above, includes loading the substrate to be processed, for example, the wafer W whose surface is made of an insulator, a semiconductor, or a metal, into the processing container 1, and placing the wafer W on the stage 2. The surface of the wafer W may be cleaned as needed.

Specific conditions for the above surface process are as follows.
 Gas flow rate: Ar/$H_2$=0 to 2,000 sccm/10 to 2,000 sccm
 Pressure: 0.1 to 10 Torr (13.3 to 1,333 Pa)
 Wafer temperature: 300 to 600 degrees C.
 Time: 10 to 120 min Subsequently, in a state in which the internal pressure of the processing container 1 and the wafer temperature are controlled to predetermined values and the surface of the wafer W does not have a catalytic function (without performing the activation process when the surface is made of the metal), a graphene structure is formed through a remote microwave plasma CVD.

Specifically, the Ar gas, which is a plasma-generating gas, is supplied from the shower ring 42 to a position directly below the microwave transmission plate 24, and microwaves generated by the microwave generator 22 are radiated into the processing container 1 so as to ignite plasma. The microwaves generated by the microwave generator 22 are guided to the slow-wave material 26 via the waveguide 27, the mode conversion mechanism 31, and the coaxial waveguide 28, and are radiated into the processing container 1 from the slow-wave material 26 via the slots 21a of the planar slot antenna 21 and the microwave transmission plate 24.

The microwaves spread as surface waves to a region directly below the microwave transmission plate 24 so that surface wave plasma based on the Ar gas is generated. This region is referred to as a plasma generation region.

Then, at a timing at which the plasma is ignited, the $C_2H_4$ gas as the carbon-containing gas, which is a film-forming raw material gas, and the $O_2$ gas as the oxidizing gas which etches defects (non-graphene structure), are supplied from the shower plate 41. At this time, the $H_2$ gas may be supplied as needed.

These gases are excited and dissociated by the plasma diffused from the plasma generation region, and are supplied to the wafer W, which is a substrate to be processed and is placed on the stage 2 below the shower plate 41. Since the wafer W is arranged in a region spaced apart from the plasma generation region and the plasma diffused from the plasma generation region is supplied to the wafer W, the plasma on the wafer W has a low electron temperature so that the wafer W is damaged less, and is turned into high-density plasma mainly composed of radicals. With such plasma, it is possible to form a graphene structure according to a general crystal growth mode such as nucleation and lateral growth without using an activated metal catalyst layer, which has conventionally been considered necessary.

At this time, the $C_2H_4$ gas as the carbon-containing gas and the $H_2$ gas (as needed) are supplied to a location below the plasma generation region from the shower plate 41 and are dissociated by the diffused plasma. Thus, it is possible to suppress excessive dissociation of these gases. However, these gases may be supplied to the plasma generation region. Further, the Ar gas, which is a plasma-generating gas, may not be used. The $C_2H_4$ gas as the carbon-containing gas, or the like, may be supplied to the plasma generation region so as to directly ignite the plasma.

Specific conditions for the remote microwave plasma CVD in the processing apparatus 100 are as follows.
 Gas Flow Rate:
  Ar gas=0 to 2,000 sccm
  $C_2H_4$ gas=0.1 to 300 sccm
  $O_2$ gas=0.1 to 10 sccm
  $H_2$ gas=0 to 500 sccm
 Pressure:
  1.33 to 667 Pa (0.01 to 5 Torr) when the wafer surface is made of insulator or semiconductor
  1.33 to 400 Pa (0.01 to 3 Torr) when the wafer surface is made of metal (not having a catalytic function)
 Temperature: 350 to 1,000 degrees C. (more specifically, 400 to 800 degrees C.)
 Microwave power: 100 to 5,000 W (more specifically, 1,000 to 3,500 W)
 Time: 1 to 200 min

[Second Example of Processing Apparatus]

Figure 5:
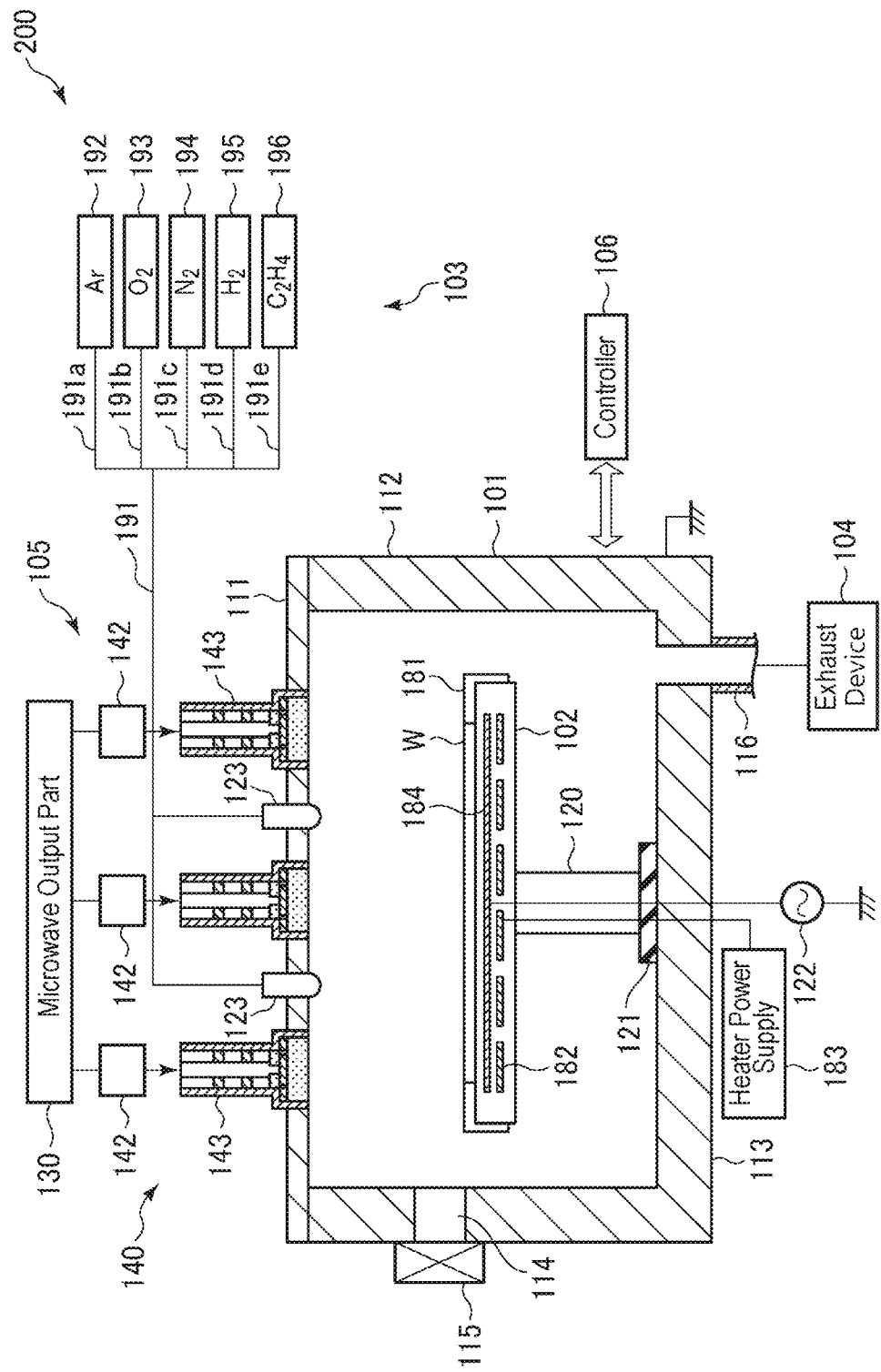
FIG. 5 is a cross-sectional view illustrating a second example of the processing apparatus suitable for carrying out the graphene structure forming method according to the embodiment of the present disclosure.
Figure 6:
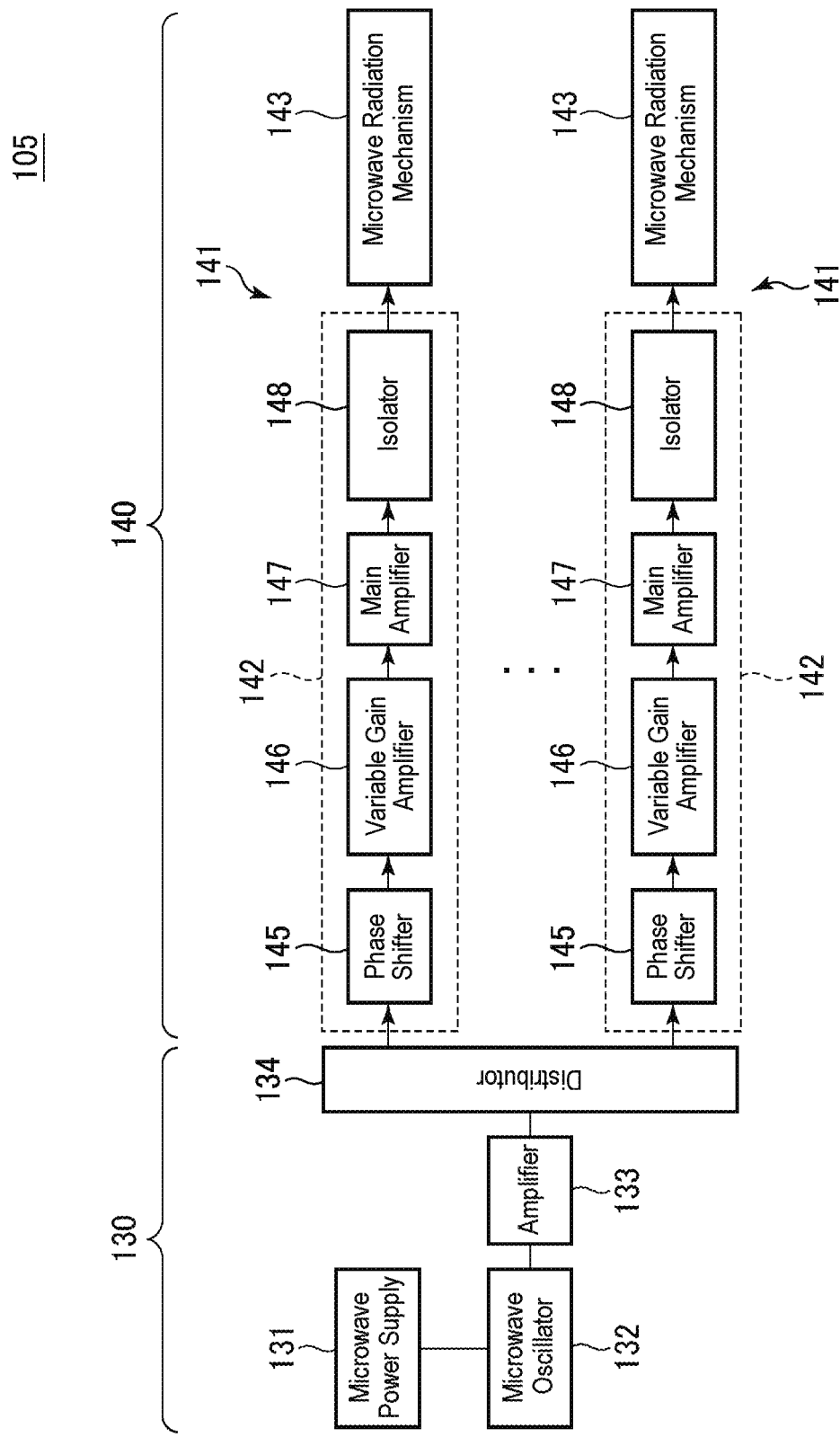
FIG. 6 is a configuration diagram illustrating a configuration of a microwave introduction device in the processing apparatus of FIG. 5.
Figure 7:
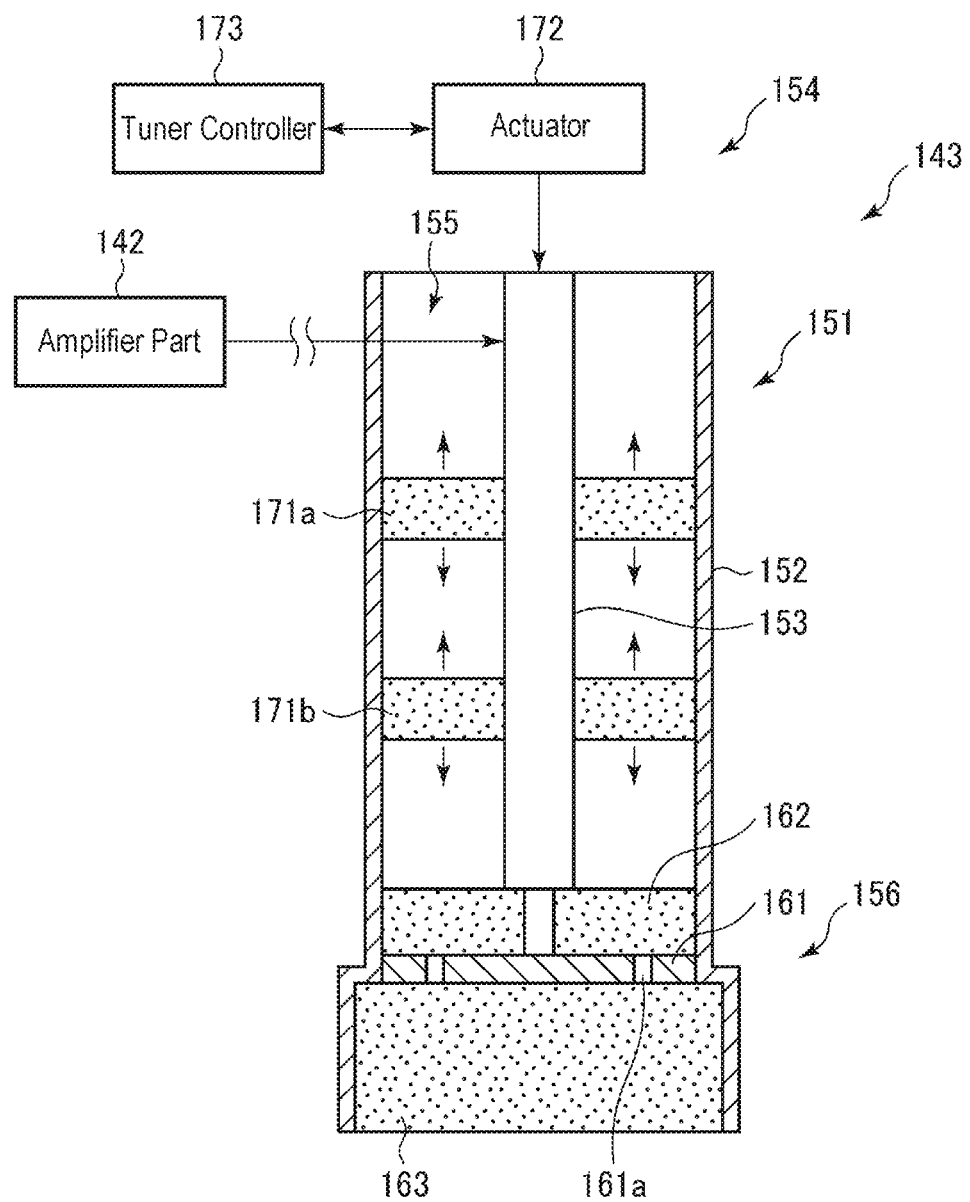
FIG. 7 is a cross-sectional view schematically illustrating a microwave radiation mechanism in the processing apparatus of FIG. 5.
Figure 8:
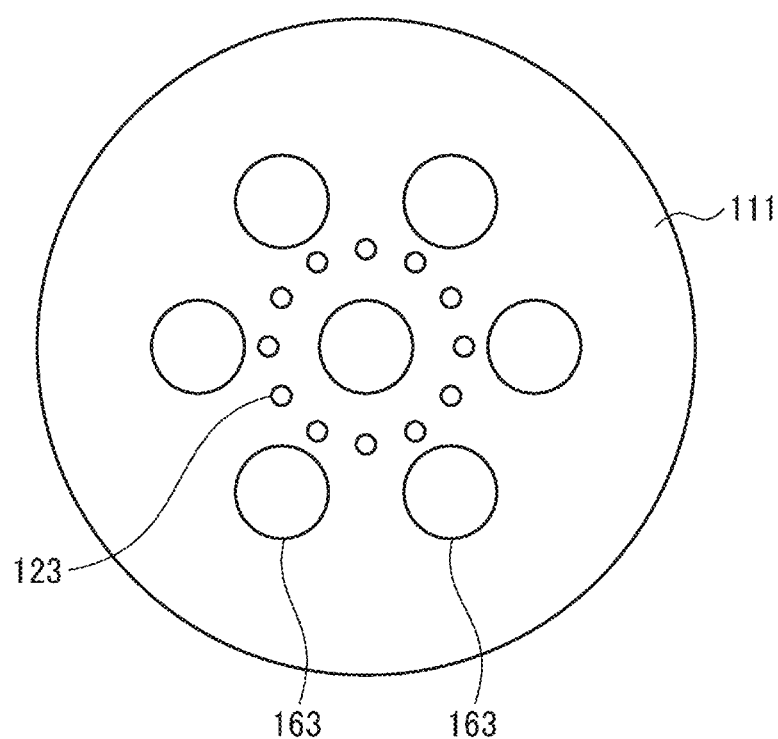
FIG. 8 is a bottom view schematically illustrating a ceiling wall portion of a processing container in the processing apparatus of FIG. 5.

FIG. 5 is a cross-sectional view schematically illustrating a second example of the processing apparatus, FIG. 6 is a block diagram illustrating a configuration of a microwave introduction device of the processing apparatus of FIG. 5, FIG. 7 is a cross-sectional view schematically illustrating a microwave radiation mechanism of the processing apparatus of FIG. 5, and FIG. 8 is a bottom view schematically illustrating a ceiling wall portion of a processing container of the processing apparatus of FIG. 5.

A processing apparatus 200 includes a processing container 101, a stage 102, a gas supply mechanism 103, an exhaust device 104, a microwave introduction device 105, and a controller 106.

The processing container 101 is for accommodating the wafer W, is formed of, for example, a metallic material, such as aluminum, an alloy thereof or the like, and has a substantially cylindrical shape. The processing container 101 has a plate-shaped ceiling wall portion 111, a bottom wall portion 113, and a side wall portion 112 connecting the ceiling wall portion 111 and the bottom wall portion 113. The microwave introduction device 105 is provided above the processing container 101, and functions as a plasma generator that introduces electromagnetic waves (microwaves) into the processing container 101 so as to generate plasma. The microwave introduction device 105 will be described in detail later.

The ceiling wall portion 111 has a plurality of opening portions into which a microwave radiation mechanism and a gas introduction part of the microwave introduction device 105 to be described later are fitted. The side wall portion 112 has a loading/unloading port 114 for loading/unloading the wafer W, which is a substrate to be processed, into/from a transfer chamber (not illustrated) adjacent to the processing container 101. The loading/unloading port 114 is opened and closed by a gate valve 115. An exhaust device 104 is provided on the bottom wall portion 113. The exhaust device 104 is provided in an exhaust pipe 116 connected to the bottom wall portion 113, and includes a vacuum pump and a pressure control valve. The interior of the processing container 101 is exhausted through the exhaust pipe 116 by the vacuum pump of the exhaust device 104. An internal pressure of the processing container 101 is controlled by the pressure control valve.

The stage 102 is disposed inside the processing container 101, and places the wafer W thereon. The stage 102 has a disc shape and is made of ceramic, such as AlN. The stage 102 is supported by a support member 120 made of ceramic, such as AlN, and extending upward from the center of the bottom of the processing container 101. A guide ring 181 for guiding the wafer W is provided on an outer edge portion of the stage 102. In addition, lifting pins (not illustrated) for moving the wafer W up and down are provided inside the stage 102 so as to be able to move up and down on the top surface of the stage 102. Further, a resistive heater 182 is embedded in the stage 102. The heater 182 heats the wafer W on the stage 102 via the stage 102 based on power from a heater power supply 183. A thermocouple (not illustrated) is inserted into the stage 102. The stage 2 is configured to be capable of controlling a heating temperature of the wafer W to a predetermined temperature in a range of, for example, 350 to 1,000 degrees C., based on a signal from the thermocouple. Further, an electrode 184 having a size similar to that of the wafer W is embedded above the heater 182 in the stage 102. A high-frequency bias power supply 122 is electrically connected to the electrode 184. A high-frequency bias for attracting ions is applied from the high-frequency bias power supply 122 to the stage 102. The high-frequency bias power supply 122 may be omitted depending on characteristics of the plasma process.

The gas supply mechanism 103 is for introducing a plasma-generating gas and a raw material gas for forming a graphene structure into the processing container 101, and has a plurality of gas introduction nozzles 123. Each gas introduction nozzle 123 is fitted into a respective opening portion formed in the ceiling wall portion 111 of the processing container 101. A gas supply pipe 191 is connected to the gas introduction nozzles 123. The gas supply pipe 191 is branched into five branch pipes 191a, 191b, 191c, 191d, and 191e. An Ar gas source 192 is connected to the branch pipe 191a to supply an Ar gas as a noble gas, which is a plasma-generating gas. An $O_2$ gas source 193 is connected to the branch pipe 191b to supply an $O_2$ gas, which is an oxidizing gas. An $N_2$ gas source 194 is connected to the branch pipe 191c to supply a $N_2$ gas used as a purge gas or the like. A $H_2$ gas source 195 is connected to the branch pipe 191d to supply a $H_2$ gas, which is a hydrogen-containing gas. A $C_2H_4$ gas source 196 is connected to the branch pipe 191e to supply an ethylene ($C_2H_4$) gas as a carbon-containing gas, which is a film-forming raw material gas. Although not illustrated, each of the branch pipes 191a, 191b, 191c, 191d, and 191e includes a mass flow controller for controlling a flow rate of each gas and valves provided front and back sides of the mass flow controller. As in the first example, it is possible to adjust dissociation of each gas by providing a shower plate and supplying the $C_2H_4$ gas and the like to a position close to the wafer W. Further, the same effect may be obtained by extending the nozzles for supplying these gases downward.

As described above, the microwave introduction device 105 is provided above the processing container 101, and functions as a plasma generator that introduces electromagnetic waves (microwaves) into the processing container 101 so as to generate plasma. As illustrated in FIG. 5, the microwave introduction device 105 includes a ceiling wall portion 111 of the processing container 101, which functions as a ceiling plate, a microwave output part 130, and an antenna unit 140.

The microwave output part 130 generates microwaves, and distributes and outputs the microwaves to a plurality of routes. As illustrated in FIG. 6, the microwave output part 130 has a microwave power supply 131, a microwave oscillator 132, an amplifier 133, and a distributor 134. The microwave oscillator 132 is a solid state, and oscillates the microwaves at, for example, 860 MHz (e.g., PLL oscillation). The frequency of the microwaves is not limited to 860 MHz, but may fall within a range of 700 MHz to 10 GHz, such as 2.45 GHz, 8.35 GHz, 5.8 GHz, 1.98 GHz, and the like. The amplifier 133 amplifies the microwaves oscillated by the microwave oscillator 132. The distributor 134 distributes the microwaves amplified by the amplifier 133 to the plurality of routes, and distributes the microwaves while matching impedances on input and output sides.

The antenna unit 140 introduces the microwaves output from the microwave output part 130 into the processing container 101. The antenna unit 140 includes a plurality of antenna modules 141, as illustrated in FIG. 6. Each of the plurality of antenna modules 141 introduces the microwaves distributed by the distributor 134 into the processing container 101. The configurations of the plurality of antenna modules 141 are all the same. Each antenna module 141 has an amplifier part 142 configured mainly to amplify and output the distributed microwaves, and a microwave radiation mechanism 143 configured to radiate the microwaves output from the amplifier part 142 into the processing container 101.

The amplifier part 142 has a phase shifter 145, a variable gain amplifier 146, a main amplifier 147, and an isolator 148. The phase shifter 145 changes a phase of the microwaves. The variable gain amplifier 146 adjusts a power level of the microwaves input to the main amplifier 147. The main amplifier 147 is configured as a solid-state amplifier. The isolator 148 separates reflected microwaves that are reflected at an antenna part of the microwave radiation mechanism 143 (to be described later) to be directed to the main amplifier 147.

As illustrated in FIG. 5, the plurality of microwave radiation mechanisms 143 are provided on the ceiling wall portion 111. As illustrated in FIG. 7, each microwave radiation mechanism 143 has a coaxial tube 151, a power feeding part 155, a tuner 154, and an antenna part 156. The coaxial tube 151 includes a cylindrical outer conductor 152, an inner conductor 153 provided coaxially with the outer conductor 152 inside the outer conductor 152, and a microwave transmission path provided between the outer conductor 152 and the inner conductor 153.

The power feeding part 155 feeds the amplified microwaves provided from the amplifier part 142 to the microwave transmission path. The microwaves amplified by the amplifier part 142 are introduced into the power feeding part 155 from the side of an upper end portion of the outer conductor 152 via a coaxial cable. For example, by radiating the microwaves from a power feeding antenna, microwave power is fed to the microwave transmission path between the outer conductor 152 and the inner conductor 153 and propagates toward the antenna part 156.

The antenna part 156 radiates the microwaves from the coaxial tube 151 into the processing container 101, and is provided in a lower end portion of the coaxial tube 151. The antenna part 156 includes a planar antenna 161 connected to a lower end portion of the inner conductor 153 and having a disc shape, a slow-wave material 162 disposed on an upper surface of the planar antenna 161, and a microwave transmission plate 163 disposed on a lower surface of the planar antenna 161. The microwave transmission plate 163 is fitted into the ceiling wall portion 111, and a lower surface thereof is exposed to an inner space of the processing container 101. The planar antenna 161 has slots 161a formed to penetrate the planar antenna 161. The shape of each slot 161a is appropriately set such that the microwaves are efficiently radiated. A dielectric material may be inserted into each slot 161a. The slow-wave material 162 is formed of a material having a dielectric constant higher than a vacuum. The phase of the microwaves may be adjusted based on a thickness of the slow-wave material 162 so that the radiation energy of the microwaves is maximized. The microwave transmission plate 163 is also made of a dielectric material and has a shape capable of efficiently radiating the microwaves in a TE mode. Then, the microwaves transmitted through the microwave transmission plate 163 generate plasma in the inner space of the processing container 101. As a material that constitutes the slow-wave material 162 and the microwave transmission plate 163, for example, quartz, ceramic, a fluorine resin such as a polytetrafluoroethylene resin, a polyimide resin and the like, may be used.

The tuner 154 matches a load impedance with a characteristic impedance of the microwave power supply 131. The tuner 154 constitutes a slug tuner. For example, as illustrated in FIG. 7, the tuner 154 includes two slugs 171a and 171b, an actuator 172 configured to drive the two slugs 171a and 171b independently of each other, and a tuner controller 173 configured to control the actuator 172. The slugs 171a and 171b are arranged at the side of a base end portion (upper end portion) rather than the side of the antenna part 156 of the coaxial tube 151.

The slugs 171a and 171b are a plate shape and ring-shape and are made of a dielectric material such as ceramic. The slugs 171a and 171b are arranged between the outer conductor 152 and the inner conductor 153 of the coaxial tube 151. Further, the actuator 172 individually drives the slugs 171a and 171b, for example, by rotating two screws provided inside the inner conductor 153 and threadedly coupled with the slugs 171a and 171b, respectively. Then, based on a command from the tuner controller 173, the actuator 172 moves the slugs 171a and 171b upward and downward. The tuner controller 173 adjusts positions of the slugs 171a and 171b such that impedance on an end portion becomes 50Ω.

The main amplifier 147, the tuner 154, and the planar antenna 161 are arranged close to each other. The tuner 154 and the planar antenna 161 constitute a lumped constant circuit and also function as a resonator. Impedance mismatch exists in a portion in which the planar antenna 161 is mounted. However, since the tuner 154 directly tunes the plasma load, it is possible to tune the impedance mismatch including plasma with high precision. Therefore, it is possible to eliminate the influence of reflection on the planar antenna 161.

As illustrated in FIG. 8, in this example, seven microwave radiation mechanisms 143 are provided. Seven microwave transmission plates 163 corresponding to the seven microwave radiation mechanisms 143 are arranged so as to be evenly arranged in a hexagonal close-packed structure. That is, one of the seven microwave transmission plates 163 is arranged at the center of the ceiling wall portion 111, and the other six microwave transmission plates 163 are arranged therearound. These seven microwave transmission plates 163 are arranged so that adjacent microwave transmission plates are evenly spaced apart from each other. In addition, the plurality of nozzles 123 of the gas supply mechanism 103 are arranged so as to surround the periphery of the central microwave transmission plate. The number of microwave radiation mechanisms 143 is not limited to seven.

The controller 106 is typically configured with a computer and controls each part of the processing apparatus 200. The controller 106 includes a storage which stores a process sequence of the processing apparatus 200 and process recipes that are control parameters, an input part, a display, and the like, and is capable of performing a predetermined control according to a selected process recipe.

When forming the graphene structure according to the above-described embodiment using the processing apparatus 200 configured as above, first, as the substrate to be processed, for example, the wafer W whose surface is made of an insulator, a semiconductor, or a metal, is loaded into the processing container 101 and is placed on the stage 102. The surface of the wafer W may be cleaned as needed.

Specific conditions for the surface process are as follows.
Gas flow rate: $Ar/H_2$=0 to 2,000 sccm/10 to 2,000 sccm
Pressure: 0.1 to 10 Torr (13.3 to 1,333 Pa)
Wafer temperature: 300 to 600 degrees C.
Time: 10 to 120 min Subsequently, in a state in which the internal pressure of the processing container 101 and the wafer temperature are controlled to predetermined values and the surface of the wafer W does not have a catalytic function (without performing the activation process when the surface is made of the metal), the graphene structure is formed through the remote microwave plasma CVD.

Specifically, the Ar gas, which is a plasma generation gas, is supplied from the gas introduction nozzle 123 to a position directly below the ceiling wall portion 111 of the processing container 101, and the microwaves are radiated into the processing container 101 so as to ignite plasma. The radiated microwaves are those distributed into the plurality of routes and output from the microwave output part 130 of the microwave introduction device 105, guided into the plurality of antenna modules 141 of the antenna unit 140, and radiated from the microwave radiation mechanisms 143.

In each antenna module 141, the microwaves are individually amplified by the main amplifier 147 constituting the solid-state amplifier, fed to each microwave radiation mechanism 143, and transmitted to the coaxial tube 151 to reach the antenna part 156. At that time, the impedances of the microwaves are automatically matched by the slugs 171a and 171b of the tuner 154. Therefore, in a state in which there is substantially no power reflection, the microwaves are radiated from the slots 161a of the planar antenna 161 from the tuner 154 through the slow-wave material 162 of the antenna part 156. Then, the microwaves further pass through the microwave transmission plate 163 and are transmitted to the surface (bottom surface) of the microwave transmission plate 163, which is in contact with the plasma, to form surface waves. The electric power from each antenna part 156 is spatially synthesized inside the processing container 101, so that surface wave plasma based on the Ar gas is generated in a region directly below the ceiling wall portion 111. This region corresponds to the plasma generation region.

Then, at a timing at which the plasma is ignited, the $C_2H_4$ gas as the carbon-containing gas, which is a film-forming raw material gas, and the $O_2$ gas as the oxidizing gas, which etches defects (non-graphene structure), are supplied from the gas introduction nozzles 123. At this time, a $H_2$ gas may be supplied as needed.

These gases are excited by plasma, dissociated, and supplied to the wafer W, which is the substrate to be processed placed on the stage 102. Since the wafer W is arranged in a region spaced apart from the plasma generation region and the plasma diffused from the plasma generation region is supplied to the wafer W, plasma having a low electron temperature is formed on the wafer W so that the wafer W is damaged less, and is turned into high-density plasma mainly composed of radicals. With such plasma, it is possible to form the graphene structure according to a general crystal growth mode such as nucleation and lateral growth without using an activated metal catalyst layer, which has conventionally been considered necessary.

In this example, the $C_2H_4$ gas as the carbon-containing gas and the $H_2$ gas (if necessary) are supplied to the plasma generation region and are dissociated therein. However, by using the same shower plate as in the first example or extending the gas introduction nozzles, the $C_2H_4$ gas and the $H_2$ gas (if necessary) may be dissociated by the plasma diffused from the plasma generation region so as to suppress the dissociation. Further, the Ar gas, which is a plasma-generating gas, may not be used. The $C_2H_4$ gas or the like, which is a carbon-containing gas, may be supplied to the plasma generation region so as to directly ignite the plasma.

In the processing apparatus 200 of this example, the microwaves distributed into the plurality of routes are individually amplified by the main amplifier 147 constituting a solid-state amplifier, and are individually introduced into the processing container 101 from the plurality of antenna parts 156, thereby forming the surface waves. Then, the surface waves are specially synthesized so as to generate microwave plasma. Therefore, a large-sized isolator and a synthesizer are not required, and thus the apparatus is compact. Further, the main amplifier 147, the tuner 154, and the planar antenna 161 are provided close to each other, and the tuner 154 and the planar antenna 161 constitute a lumped constant circuit and also function as a resonator. As a result, the tuner 154 can perform tuning with high precision including plasma in the flat slot antenna mounting portion where impedance mismatch exists. Thus, the influence of reflection can be reliably eliminated and high-precision plasma control becomes possible. Further, since the plurality of microwave transmission plates 163 are provided, the total area may be made smaller than that of the single microwave transmission plate 24 in the processing apparatus of the first example. Therefore, it is possible to reduce the microwave power that is required to stably ignite and discharge plasma.

Specific conditions for the remote microwave plasma CVD in the processing apparatus 200 are basically the same as those in the first example. However, more specific conditions of some items are different from each other, as follows.

Gas Flow Rate:
    Ar gas=0 to 2,000 sccm
    $C_2H_4$ gas=0.1 to 300 sccm
    $O_2$ gas=0.1 to 10 sccm
    $H_2$ gas=0 to 500 sccm Pressure:
    1.33 to 667 Pa (0.01 to 5 Torr) when the wafer surface is made of insulator or semiconductor
    1.33 to 400 Pa (0.01 to 3 Torr) when the wafer surface is made of metal (not having a catalytic function)

Temperature: 350 to 1,000 degrees C. (more specifically, 400 to 800 degrees C.)

Microwave power: 100 to 5,000 W (more specifically, 1,000 to 3,500 W)

Time: 1 to 200 min

TEST EXAMPLES

Next, test examples will be described.

Test Example 1

In Test example 1, as a substrate to be processed, a wafer having a $SiO_2$ film formed on a Si base (without a catalytic metal layer) was provided, and the remote microwave plasma CVD was performed using the processing apparatus of the first example, and using the $C_2H_4$ gas as a carbon-containing gas, the Ar gas as a noble gas, and the $O_2$ gas as an oxidizing gas. At this time, the flow rate of the $C_2H_4$ gas was set to 20 sccm, the flow rate of the Ar gas was set to 500 sccm, and the flow rate of the $O_2$ gas was varied between 0 and 10 sccm.

As other conditions, the pressure was set to 0.4 Torr, the temperature was set to 400 degrees C., the microwave power was set to 2 kW, and the time was set to 40 min.

Figure 9:
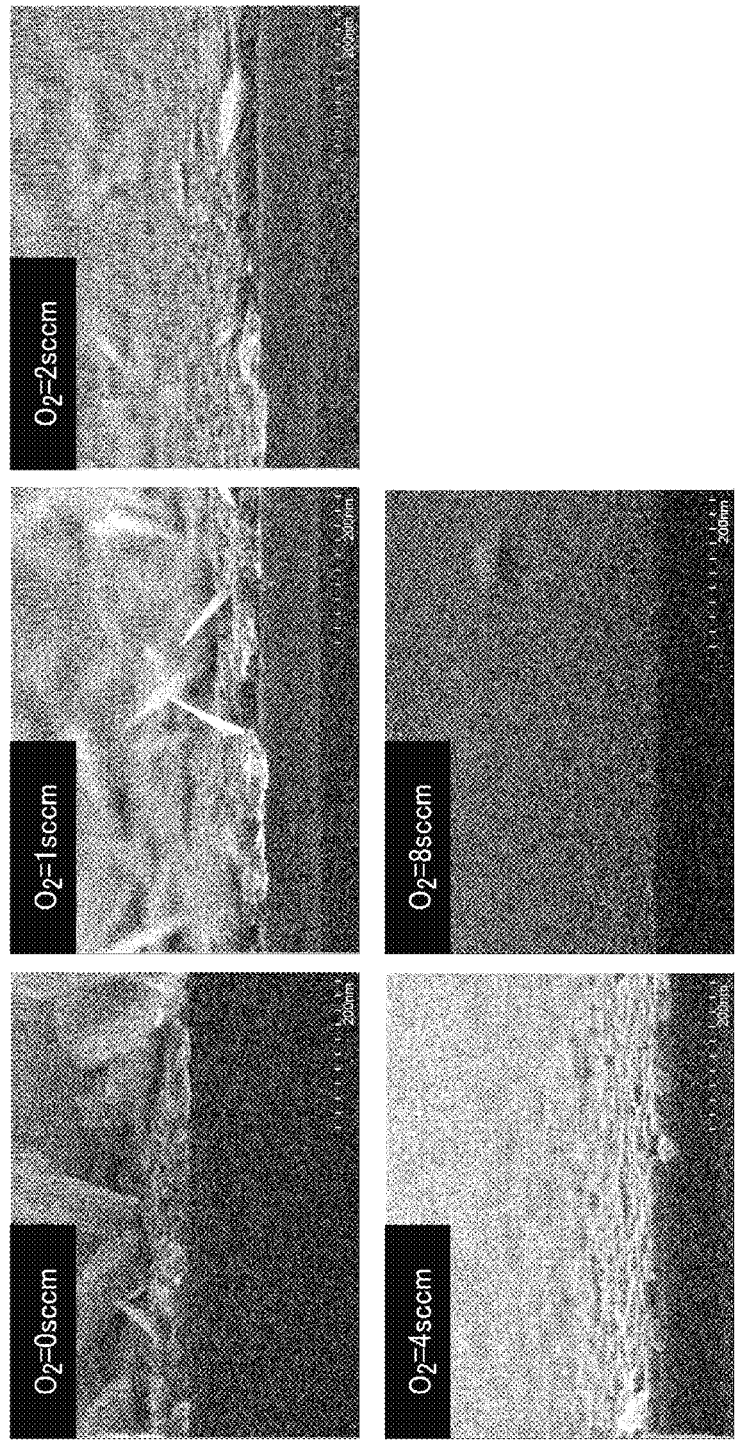
FIG. 9 is SEM photographs illustrating graphene structures formed by changing a flow rate of an $O_2$ gas in Test Example 1.

FIG. 9 illustrates SEM photographs of graphene films when the graphene films were formed by changing the flow rate of the $O_2$ gas to 0 sccm, 1 sccm, 2 sccm, 4 sccm, and 8 sccm. From FIG. 9, as the flow rate of the $O_2$ gas increases, the deposition amount of the formed graphene film decreases. Particularly, comparing the cases in which the flow rates of the $O_2$ gas were 4 sccm and 8 sccm, it can be seen that the nucleation density decreases due to the increased flow rate of the $O_2$ gas. From this, the etching effect of the $O_2$ gas was confirmed.

Figure 10:
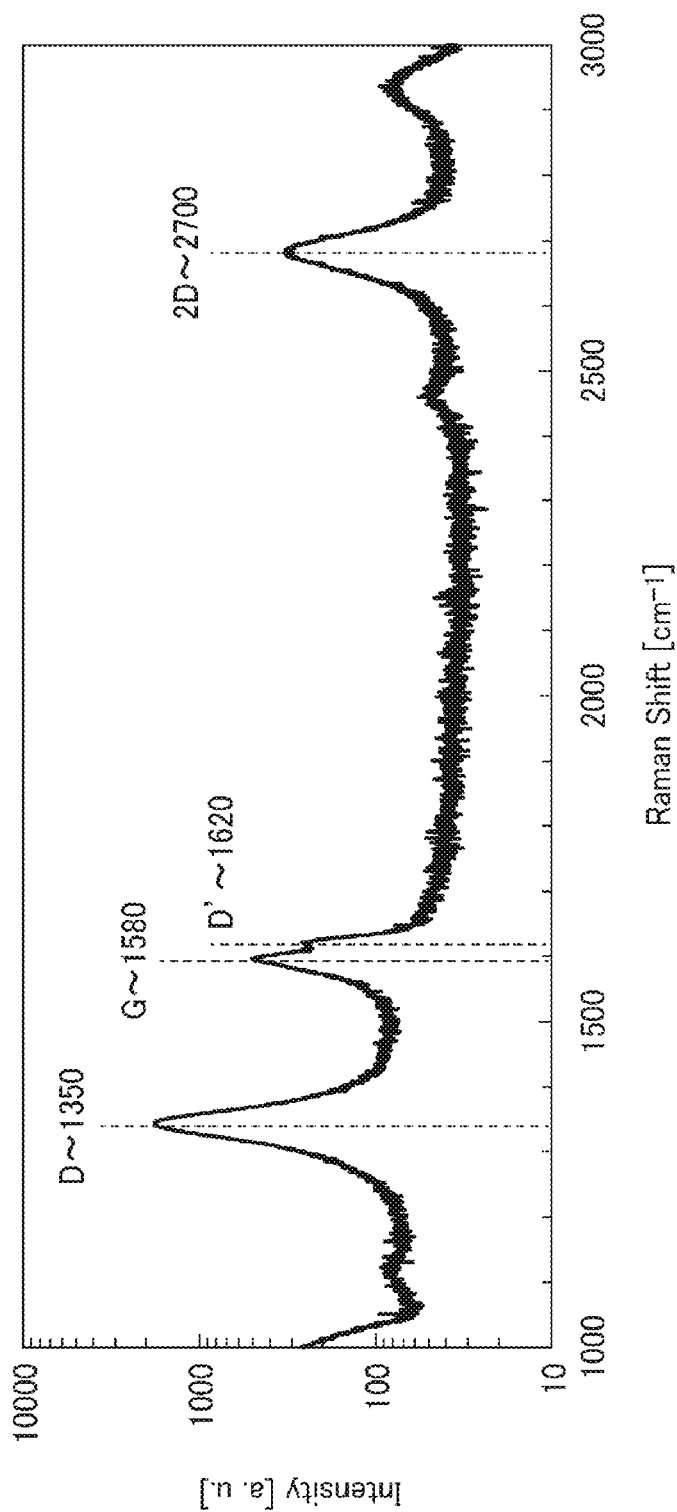
FIG. 10 is a diagram showing a Raman spectrum of typical graphene.

Next, the effect of the addition of the $O_2$ gas on the crystallinity of graphene was investigated. The crystallinity of graphene can be grasped based on a Raman spectrum. FIG. 10 is a view showing a Raman spectrum of typical graphene. In FIG. 10, G is a peak derived from a graphene structure, and D' is a peak derived from a defective structure. Therefore, a G/D' ratio may be used as an index of the crystallinity of graphene. That is, the larger the G/D' ratio, the better the crystallinity of graphene.

Figure 11:
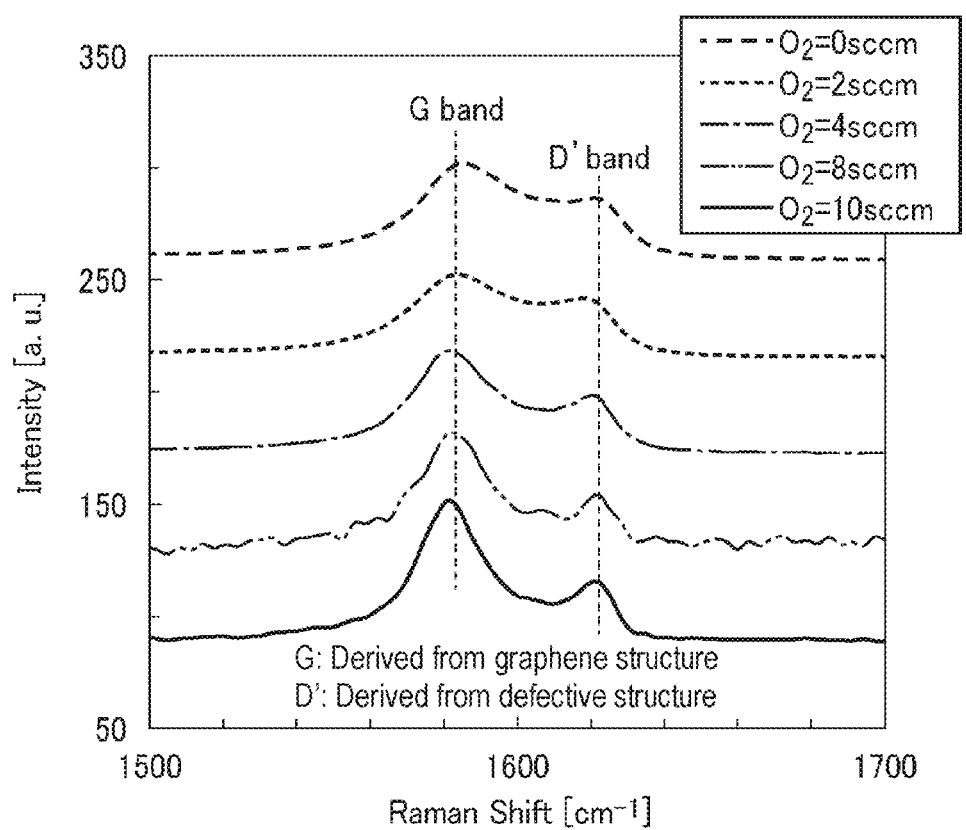
FIG. 11 is a diagram showing Raman spectra of graphene structures formed in Test Example 1 by setting the flow rate of the $O_2$ gas to 0 sccm, 2 sccm, 4 sccm, 8 sccm, and 10 sccm.
Figure 12:
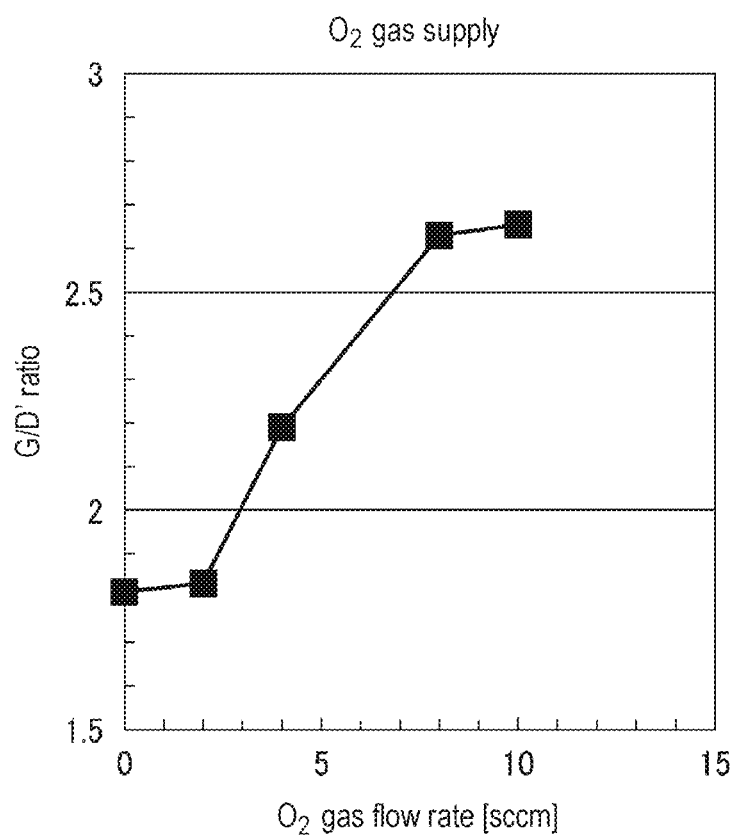
FIG. 12 is a view illustrating a relationship between the flow rate of the $O_2$ gas and a G/D' ratio in Test Example 1.

FIG. 11 is a view showing Raman spectra of graphene structures formed by setting the flow rate of the $O_2$ gas to 0 sccm, 2 sccm, 4 sccm, 8 sccm, and 10 sccm. In FIG. 11, for the sake of convenience in illustration, the respective spectra of the flow rates of the $O_2$ gas are overlappingly indicated the height direction. FIG. 12 is a view illustrating a relationship between the flow rate of the $O_2$ gas and the G/D' ratio at that time. As shown in these figures, it was confirmed that the G/D' ratio is increased with an increase in the flow rate of the $O_2$ gas (the amount of the added $O_2$ gas), and the crystallinity of the graphene structure is improved by the addition of the $O_2$ gas.

Figure 13:
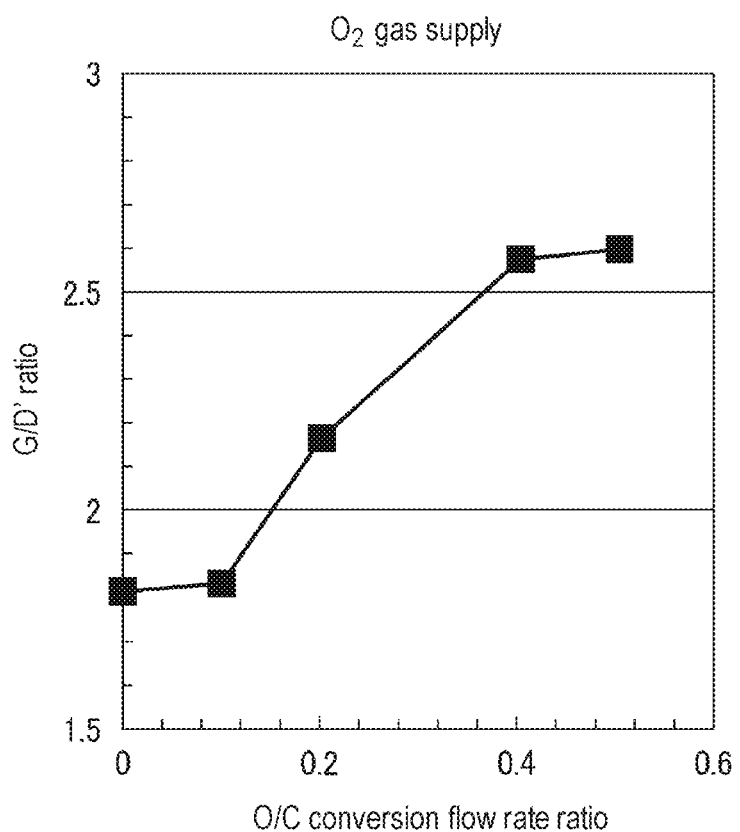
FIG. 13 is a view illustrating a relationship between an O/C conversion flow rate ratio obtained by converting a ration of the flow rate of the $O_2$ gas to a flow rate of a $C_2H_4$ gas by the number of oxygen atoms/the number of carbon atoms, and the G/D' ratio, in Test Example 1.

FIG. 13 is a view illustrating a relationship between the O/C conversion flow rate ratio obtained by converting the ratio of the flow rate of the $O_2$ gas to the flow rate of the $C_2H_4$ gas by the number of oxygen atoms/the number of carbon atoms, and the G/D' ratio, based on the results described above. From FIG. 13, it can be seen that the G/D' ratio increases when the O/C conversion flow rate ratio is 0.1 or more and that the G/D' ratio is saturated at 0.5. From this, it was confirmed that the preferable range of the O/C conversion flow rate ratio is 0.1 to 0.5 when the $O_2$ gas was used as the oxidizing gas.

Test Example 2

In Test example 2, as a substrate to be processed, a wafer having a $SiO_2$ film formed on a Si base (without a catalytic metal layer), was provided, and the remote microwave plasma CVD was performed using the processing apparatus of the first example and using the $C_2H_2$ gas as a carbon-containing gas, the Ar as a noble gas, and the $H_2O$ gas (water vapor) as an oxidizing gas. At this time, the flow rate of the $C_2H_2$ gas was set to 0.6 sccm, the flow rate of the Ar gas was set to 90 sccm, and the flow rate of the $H_2O$ gas was changed between 0 and 8 sccm.

As other conditions, the pressure was set to 0.036 to 0.05 Torr, the temperature was set to 600 degrees C., the microwave power was set to 400 W, and the time was set to 10 min.

Figure 14:
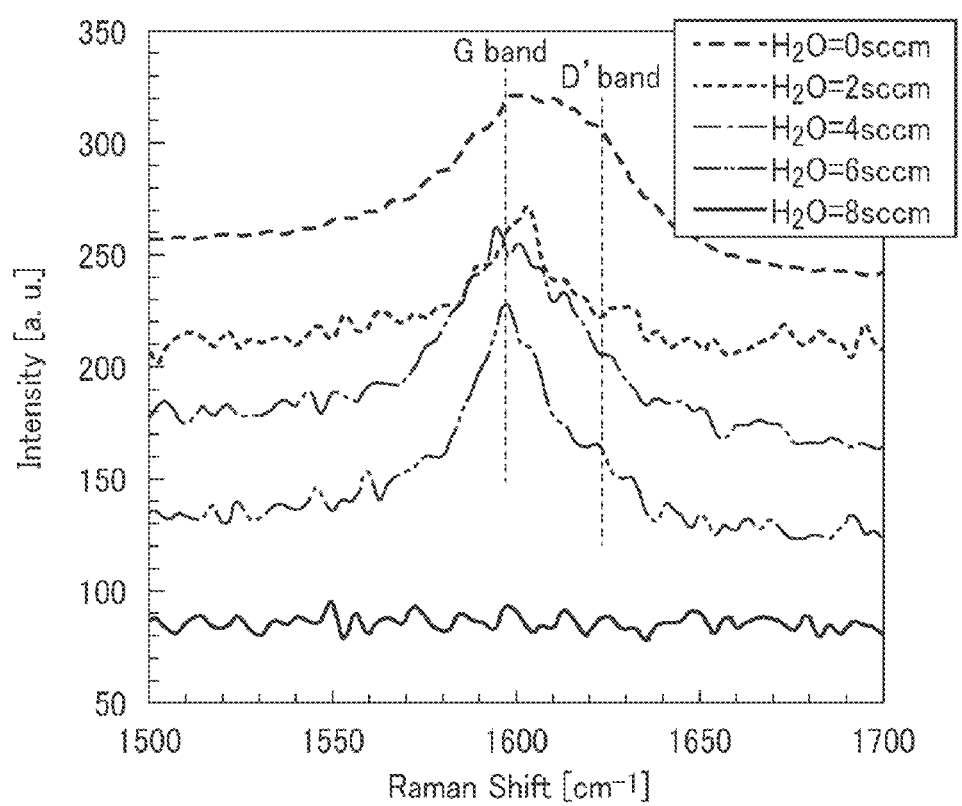
FIG. 14 is a view showing Raman spectra of graphene structures formed in Test Example 2 by setting a flow rate of a $H_2O$ gas to 0 sccm, 2 sccm, 4 sccm, and 8 sccm.

FIG. 14 is a view showing Raman spectra of graphene structures formed by setting the flow rate of the $H_2O$ gas to 0 sccm, 2 sccm, 4 sccm, and 8 sccm. In FIG. 14, for the sake of convenience in illustration, the respective spectra of the flow rates of the $H_2O$ gas are overlappingly indicated in the height direction. FIG. 15 is a view illustrating a relationship between the flow rate of the $H_2O$ gas and the G/D' ratio at that time. As shown in these figures, it was confirmed that the G/D' ratio increased with an increase in the flow rate of the $H_2O$ gas (the amount of the added $H_2O$ gas), and the crystallinity of the graphene structure was improved by the addition of the $H_2O$ gas.

FIG. 16 is a view illustrating a relationship between the O/C conversion flow rate ratio obtained by converting a ratio of the flow rate of the $H_2O$ gas to the flow rate ratio of the $C_2H_2$ gas by the number of oxygen atoms/the number of carbon atoms, and the G/D' ratio, based on the results described above. From FIG. 16, it can be seen that the G/D' ratio increases until the O/C conversion flow rate ratio reaches 4 and that the G/D' ratio decreases when the O/C conversion flow rate ratio exceeds 4. From this, it was confirmed that the preferable range of the O/C conversion flow rate ratio is 4 or less when the $H_2O$ gas is used as the oxidizing gas.

Other Applications

Although the embodiments have been described above, it should be noted that the embodiments disclosed herein are exemplary in all respects and are not restrictive. The above-described embodiments may be omitted, replaced or modified in various forms without departing from the scope and spirit of the appended claims.

For example, the plasma CVD is not limited to the microwave plasma CVD. Further, the processing apparatus for performing the remote microwave plasma CVD is not limited to the above example, and various types of processing apparatuses may be used.

Further, as a substrate to be processed for forming a graphene structure thereon, a semiconductor wafer based on a semiconductor base, such as Si, has been described as an example, but the present disclosure is not limited thereto.

EXPLANATION OF REFERENCE NUMERALS 1, 101: processing container, 2, 102: stage, 3: microwave induction mechanism, 4, 103: gas supply mechanism, 5: exhaust part, 6, 106: controller, 82, 104: exhaust device, 100, 200: processing apparatus, 105: microwave introduction mechanism, 300: substrate to be processed, 301: semiconductor base, 302: insulating film, 303: barrier film, 304: metal film, 310: graphene structure, W: wafer

What is claimed is:

1. A method of forming a graphene structure, the method comprising:
   providing a substrate to be processed; and
   forming a graphene structure on a surface of the substrate to be processed by a plasma CVD using plasma of a processing gas including a carbon-containing gas and an oxidizing gas in a state in which the surface of the substrate to be processed does not have a catalytic function.

2. The method of claim 1, wherein the surface of the substrate to be processed is made of one of an insulator, a semiconductor, or a non-activated metal.

3. The method of claim 1, wherein the plasma CVD is a remote microwave plasma CVD.

4. The method of claim 3, wherein the forming the graphene structure is performed at a temperature of the substrate to be processed in a range of 350 to 1,000 degrees C., a microwave power in a range of 100 to 5,000 W, and a time in a range of 1 to 200 min.

5. The method of claim 1, wherein the oxidizing gas is an oxygen gas.

6. The method of claim 5, wherein a flow rate ratio of a flow rate of the oxygen gas to a flow rate of a carbon-containing gas is 0.1 to 0.5 in terms of an O/C conversion flow rate ratio obtained by converting the flow rate ratio into the number of oxygen atoms in the oxygen gas/the number of carbon atoms in the carbon-containing gas.

7. The method of claim 1, wherein the oxidizing gas is a water vapor.

8. The method of claim 7, wherein a flow rate ratio of a flow rate of the water vapor to a flow rate of a hydrocarbon gas is 4 or less in terms of an O/C conversion flow rate ratio obtained by converting the flow rate ratio into the number of oxygen atoms in the water vapor/the number of carbon atoms in the hydrocarbon gas.

9. The method of claim 1, wherein the processing gas further includes a hydrogen gas.

* * * * *